(12) United States Patent
Chen et al.

(10) Patent No.: US 11,800,298 B2
(45) Date of Patent: Oct. 24, 2023

(54) MICRO-ELECTRO MECHANICAL DEVICE WITH VIBRATION SENSOR AND MICRO-ELECTRO MECHANICAL MICROPHONE

(71) Applicant: Merry Electronics(Shenzhen) Co., Ltd., ShenZhen (CN)

(72) Inventors: Jen-Yi Chen, Taichung (TW); Yueh-Kang Lee, Taichung (TW); Chao-Sen Chang, Taichung (TW)

(73) Assignee: Merry Electronics(Shenzhen) Co., Ltd., ShenZhen (CN)

( * ) Notice: Subject to any disclaimer, the term of this patent is extended or adjusted under 35 U.S.C. 154(b) by 14 days.

(21) Appl. No.: 17/738,025

(22) Filed: May 6, 2022

(65) Prior Publication Data
US 2022/0408197 A1  Dec. 22, 2022

(30) Foreign Application Priority Data

Jun. 18, 2021 (TW) ................................. 110122338
Mar. 14, 2022 (TW) ................................. 111109128

(51) Int. Cl.
| | |
|---|---|
| *H04R 19/04* | (2006.01) |
| *H04R 1/04* | (2006.01) |
| *B81B 7/00* | (2006.01) |
| *H04R 7/04* | (2006.01) |
| *G01H 3/00* | (2006.01) |
| *H04R 3/00* | (2006.01) |

(52) U.S. Cl.
CPC ............. *H04R 1/04* (2013.01); *B81B 7/0061* (2013.01); *G01H 3/00* (2013.01); *H04R 3/00* (2013.01); *H04R 7/04* (2013.01); *B81B 2201/0257* (2013.01); *B81B 2203/0127* (2013.01); *H04R 2201/003* (2013.01)

(58) Field of Classification Search
CPC ...... H04R 19/04; H04R 19/016; H04R 19/01; H04R 19/005; H04R 1/04; H04R 3/00; H04R 3/06; H04R 7/04; H04R 2201/003; B81B 7/0061; B81B 2201/0257; B81B 2203/0127; G01H 3/00
USPC ......................... 381/113, 111, 355, 369, 170
See application file for complete search history.

(56) References Cited

U.S. PATENT DOCUMENTS

2012/0250897 A1* 10/2012 Michel ................... H04R 19/04
                                                          381/111
2020/0196065 A1*  6/2020 Pedersen ............... H04R 19/005

FOREIGN PATENT DOCUMENTS

| CN | 210065158 U | * | 2/2020 | ............... B81B 7/00 |
| WO | WO-2022000794 A1 | * | 1/2022 | ............... H04R 19/00 |

* cited by examiner

*Primary Examiner* — Ahmad F. Matar
*Assistant Examiner* — Sabrina Diaz
(74) *Attorney, Agent, or Firm* — JCIPRNET

(57) ABSTRACT

A micro-electro mechanical device includes a casing, a vibration sensor, a vibration membrane assembly, and a micro-electro mechanical microphone. The casing has a sound-receiving hole, and the vibration sensor is disposed in the casing. The vibration membrane assembly is disposed in the casing and corresponds to the vibration sensor. The micro-electro mechanical microphone is disposed in the casing and corresponds to the sound-receiving hole, and a back cavity of the micro-electro mechanical microphone is formed in the casing. The back cavity at least partially overlaps with areas corresponding to a vertical projection of the vibration membrane assembly.

12 Claims, 5 Drawing Sheets

MICRO-ELECTRO MECHANICAL DEVICE WITH VIBRATION SENSOR AND MICRO-ELECTRO MECHANICAL MICROPHONE

CROSS-REFERENCE TO RELATED APPLICATION

This application claims the priority benefit of Taiwan application serial no. 110122338, filed on Jun. 18, 2021, and Taiwan application serial no. 111109128, filed on Mar. 14, 2022. The entirety of each of the above-mentioned patent applications is hereby incorporated by reference herein and made a part of this specification.

BACKGROUND

Technical Field

The disclosure relates to an electronic device and more particularly relates to a micro-electro mechanical device.

Description of Related Art

In the current market, micro-electro mechanical microphones and vibration sensors are quite mature hardware devices. A micro-electro mechanical microphone is suitable for receiving sound wave signals from the air while a vibration sensor is suitable for receiving vibration signals from an object. However, at present there is no technology for integrating the micro-electro mechanical microphone and the vibration sensor on the market. Therefore, how to integrate the micro-electro mechanical microphone and the vibration sensor into a single unit and effectively improve their sensing effects requires further research in this field.

SUMMARY

The disclosure provides a micro-electro mechanical device that achieves favorable sound sensing and vibration sensing effects.

The micro-electro mechanical device according to an embodiment of the disclosure includes a casing, a vibration sensor, a vibration membrane assembly, and a micro-electro mechanical microphone. The casing has a sound-receiving hole, and the vibration sensor is disposed in the casing. The vibration membrane assembly is disposed in the casing and corresponds to the vibration sensor. The micro-electro mechanical microphone is disposed in the casing and corresponds to the sound-receiving hole. A back cavity of the micro-electro mechanical microphone is formed in the casing. The back cavity at least partially overlaps with areas corresponding to a vertical projection of the vibration membrane assembly.

In an embodiment of the disclosure, the casing includes a base. The base includes a first bottom plate, and a second bottom plate located above the first bottom plate and separated from the first bottom plate. The vibration sensor and the micro-electro mechanical microphone are disposed on the second bottom plate.

In an embodiment of the disclosure, the first bottom plate has a first sub-sound-receiving hole, and the second bottom plate has a second sub-sound-receiving hole corresponding to the first sub-sound-receiving hole. The first sub-sound-receiving hole and the second sub-sound-receiving hole together form the sound-receiving hole.

In an embodiment of the disclosure, the casing includes a side casing, and the side casing is disposed on the second bottom plate. The side casing includes a side wall, and a first inner partition plate and a second inner partition plate located in the side wall. The vibration sensor is located between the first inner partition plate and the second inner partition plate, and the micro-electro mechanical microphone and the vibration sensor are separated by the second inner partition plate.

In an embodiment of the disclosure, the second bottom plate has at least one first through hole, a second through hole, and at least one third through hole. The first inner partition plate and a part of the side wall form an airflow channel. The at least one first through hole is located corresponding to the airflow channel. The vibration sensor covers the second through hole of the second bottom plate, and the at least one third through hole is a part of the back cavity.

In an embodiment of the disclosure, the second bottom plate has a long side and a short side, and the at least one first through hole is close to the short side and extends along a direction of the short side.

In an embodiment of the disclosure, the second bottom plate has a long side and a short side, and the at least one first through hole is close to the long side and extends along a direction of the long side.

In an embodiment of the disclosure, the second bottom plate has a long side and a short side. The at least one first through hole includes a plurality of first through holes, and the plurality of first through holes are close to the long side and are arranged along a direction of the long side.

In an embodiment of the disclosure, a diameter of each of the plurality of first through holes is greater than 100 μm, and the number of the plurality of first through holes is greater than or equal to three.

In an embodiment of the disclosure, a first cavity is formed between the first bottom plate and the second bottom plate. The airflow channel communicates with the first cavity through the at least one first through hole, and the back cavity is separated from the first cavity.

In an embodiment of the disclosure, the micro-electro mechanical device further includes an upper cover. The side casing is located between the base and the upper cover, and the back cavity is formed between the second inner partition plate, a part of the side wall, the first bottom plate, the second bottom plate, and the upper cover.

In an embodiment of the disclosure, the back cavity between the first bottom plate and the second bottom plate extends to the areas corresponding to the vertical projection of the vibration membrane assembly.

In an embodiment of the disclosure, the micro-electro mechanical device further includes an upper cover. The side casing is located between the base and the upper cover. The vibration membrane assembly is disposed between the side casing and the upper cover. A first cavity is formed between the first bottom plate and the second bottom plate. An area of a projection of the first cavity on the first bottom plate is smaller than an area of a projection of the back cavity on the first bottom plate. A second cavity is located between the first inner partition plate and the second inner partition plate. A third cavity is formed between the vibration membrane assembly and the upper cover, and the third cavity is in air communication with the first cavity through the airflow channel.

Based on the above, in the micro-electro mechanical device according to the disclosure, the vibration sensor and the micro-electro mechanical microphone are both located in the casing, and the back cavity, in which the micro-electro mechanical microphone is located, at least partially overlaps with the areas corresponding to the vertical projection of the vibration membrane assembly so as to enlarge the back cavity of the micro-electro mechanical microphone, which helps a sound wave to more easily drive the membrane structure of the micro-electro mechanical microphone to vibrate and thereby improves the sensitivity of the micro-electro mechanical microphone. In addition, the micro-electro mechanical device integrates the vibration sensor and the micro-electro mechanical microphone so that the micro-electro mechanical device can simultaneously sense the bone conduction vibration of the user and an acoustic signal in the air. Accordingly, the micro-electro mechanical device has better sensing capability.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAILED DESCRIPTION OF DISCLOSED EMBODIMENTS

Figure 1:
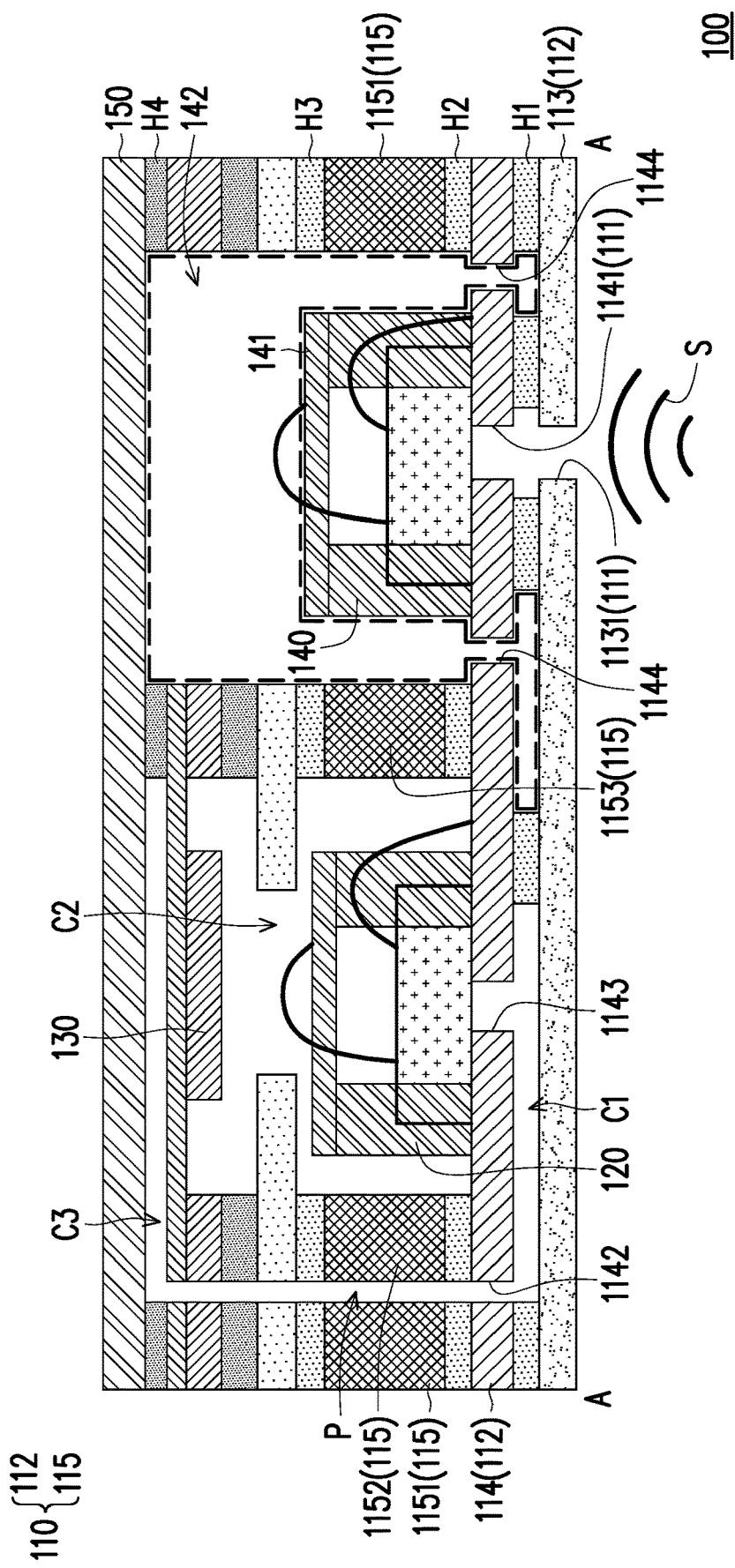
FIG. 1 is a schematic cross-sectional view of a micro-electro mechanical device according to an embodiment of the disclosure.
Figure 2:
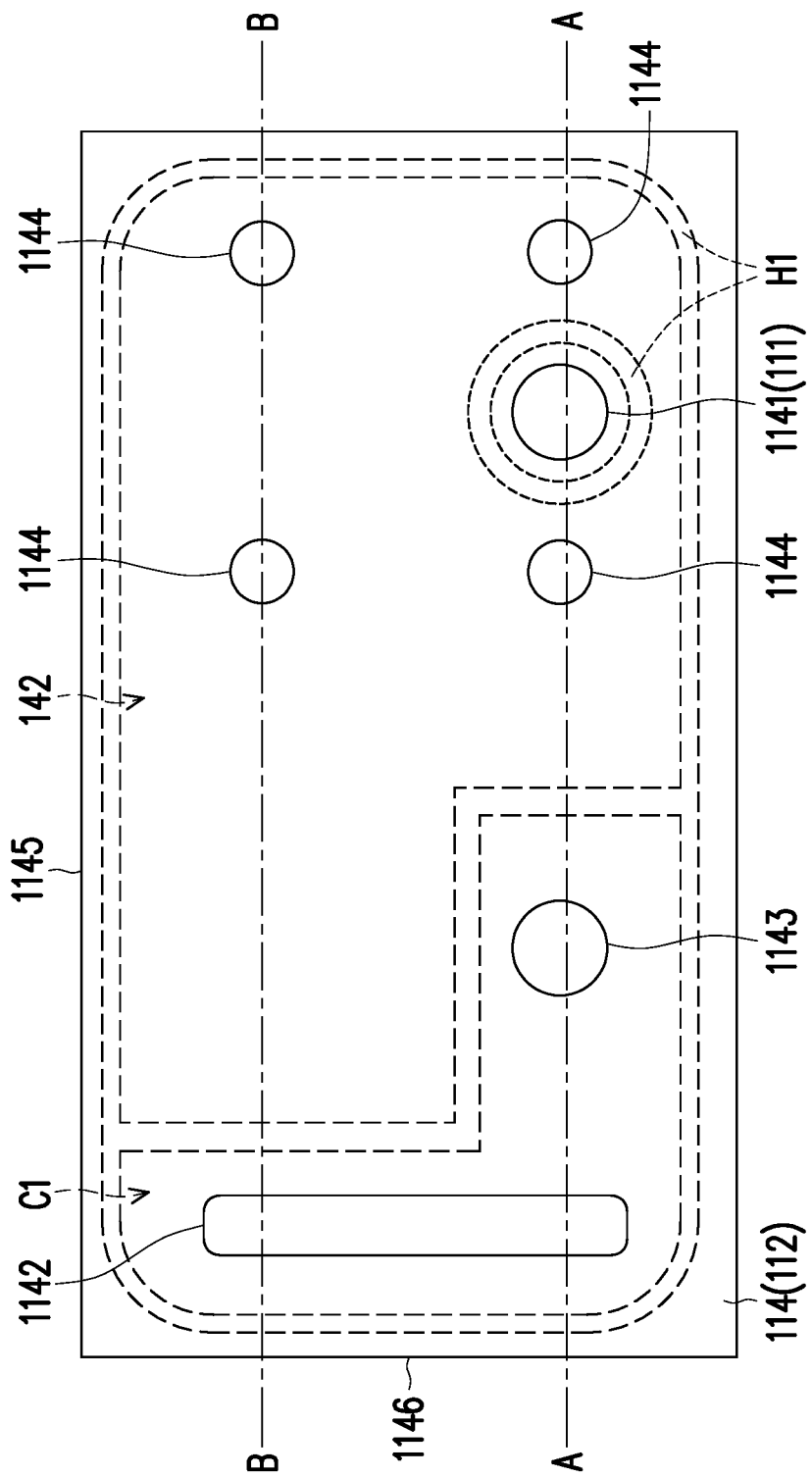
FIG. 2 is a schematic top view of a second bottom plate of the micro-electro mechanical device of FIG. 1.
Figure 3:
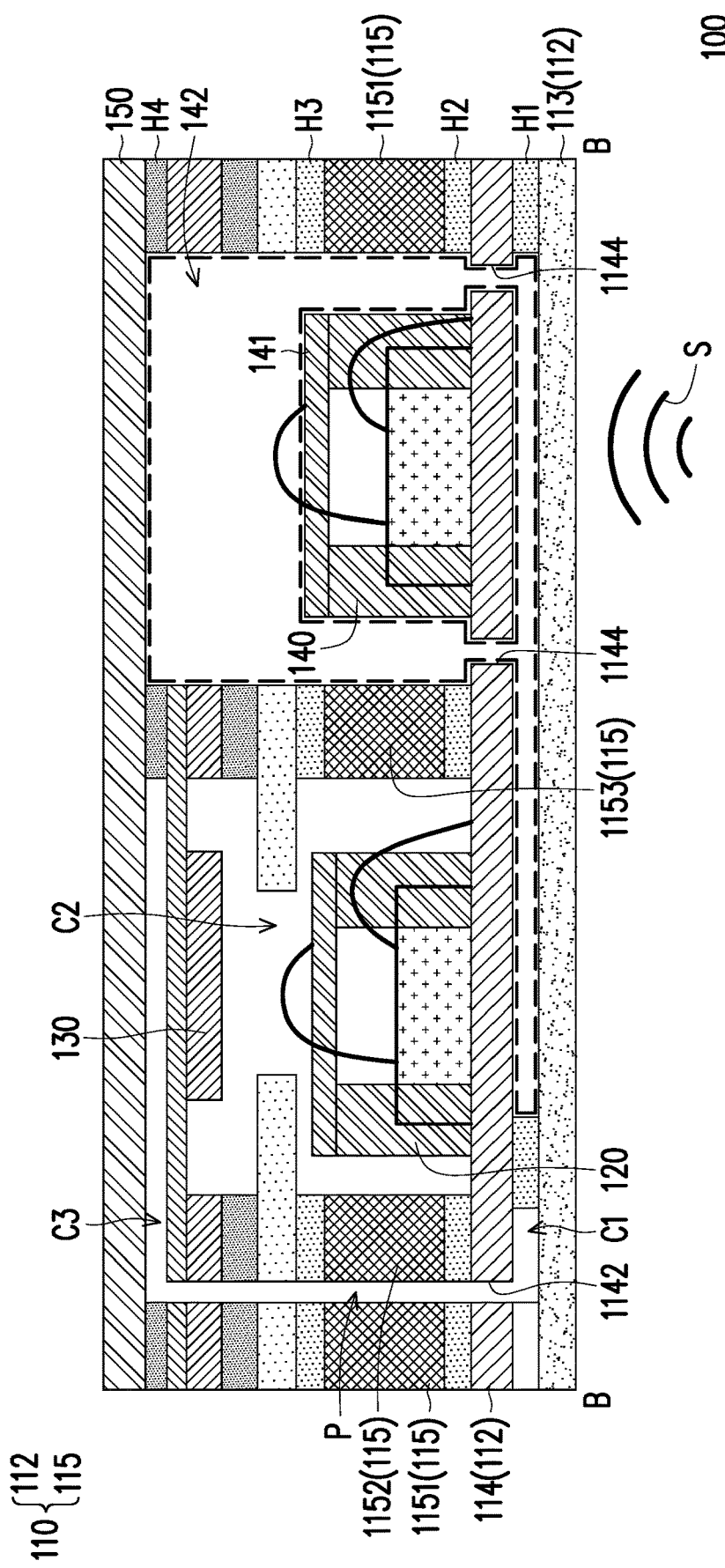
FIG. 3 is a schematic cross-sectional view of the micro-electro mechanical device of FIG. 1 in another position.

FIG. 1 is a schematic cross-sectional view of a micro-electro mechanical device according to an embodiment of the disclosure, FIG. 2 is a schematic top view of a second bottom plate of the micro-electro mechanical device of FIG. 1, and FIG. 3 is a schematic cross-sectional view of the micro-electro mechanical device of FIG. 1 in another position.

It should be noted that FIG. 2 includes a section line AA and a section line BB. FIG. 1 and FIG. 3 are schematic cross-sectional views of the micro-electro mechanical device according to an embodiment of the disclosure respectively taken along the section line AA and the section line BB.

Referring to FIG. 1 to FIG. 3, the micro-electro mechanical device 100 of this embodiment includes a casing 110, a vibration sensor 120, a vibration membrane assembly 130, and a micro-electro mechanical microphone 140. The casing 110 has a sound-receiving hole 111, and the vibration sensor 120 is disposed in the casing 110. The vibration membrane assembly 130 is disposed in the casing 110 and corresponds to the vibration sensor 120. The micro-electro mechanical microphone 140 has a membrane structure 141 and the micro-electro mechanical microphone 140 is disposed in the casing 110. In addition, the micro-electro mechanical microphone 140 corresponds to the sound-receiving hole 111.

In this embodiment, the micro-electro mechanical device 100 integrates the vibration sensor 120 and the micro-electro mechanical microphone 140. Therefore, when the micro-electro mechanical device 100 is used as a component of a head-mounted device (not shown) such as an earphone to be worn by a user, the micro-electro mechanical device 100 can simultaneously sense bone conduction vibration of the user and an acoustic signal in the air. Accordingly, the micro-electro mechanical device 100 has better sensing capability.

In addition, the casing 110 of this embodiment includes a side casing 115. The side casing 115 includes a side wall 1151, and a first inner partition plate 1152 and a second inner partition plate 1153 that are located in the side wall 1151. The vibration sensor 120 is located between the first inner partition plate 1152 and the second inner partition plate 1153, and the micro-electro mechanical microphone 140 and the vibration sensor 120 are separated by the second inner partition plate 1153. Further, the micro-electro mechanical microphone 140 and the vibration sensor 120 share the second inner partition plate 1153. Since the micro-electro mechanical microphone 140 and the vibration sensor 120 do not have respective inner partition plates, the overall size of the micro-electro mechanical device 100 is reduced.

Furthermore, the casing 110 of this embodiment includes a base 112, and the base 112 includes a first bottom plate 113 and a second bottom plate 114. The second bottom plate 114 is located above the first bottom plate 113 and is separated from the first bottom plate 113 by a spacer H1. The side casing 115 is disposed on the second bottom plate 114 through a spacer H2, and the vibration sensor 120 and the micro-electro mechanical microphone 140 are also disposed on the second bottom plate 114. Further, the vibration sensor 120 and the micro-electro mechanical microphone 140 share the second bottom plate 114. The spacer H1 and the spacer H2 of this embodiment are solder, but the disclosure is not limited thereto.

In addition, a back cavity 142 of the micro-electro mechanical microphone 140 is formed in the casing 110 of this embodiment. A range of the back cavity 142, as indicated by the dotted lines in FIG. 1 and FIG. 3, covers a cavity where the micro-electro mechanical microphone 140 is located, and extends to a space between the first bottom plate 113 and the second bottom plate 114. The space between the first bottom plate 113 and the second bottom plate 114 of the back cavity 142 corresponds to a range on the first bottom plate 113 as shown in FIG. 2. The back cavity 142 between the first bottom plate 113 and the second bottom plate 114 at least partially overlaps with areas corresponding to a vertical projection of the vibration membrane assembly 130. In other words, the back cavity 142 covers a part of the space in the first bottom plate 113 and the second bottom plate 114, which corresponds to the vibration sensor 120, so as to increase the size of the back cavity 142.

Since the conventional micro-electro mechanical microphone is designed as an independent component, it is difficult to effectively increase the space of the back cavity without changing the size of the micro-electro mechanical microphone. Because of the configuration as described above, the micro-electro mechanical microphone 140 in the micro-electro mechanical device 100 of this embodiment has the enlarged back cavity 141, which helps a sound wave S to more easily drive the membrane structure 141 of the micro-electro mechanical microphone 140 to vibrate, thereby improving the sensitivity of the micro-electro mechanical microphone 140 to the sound wave S.

In this embodiment, the first bottom plate 113 of the base 112 has a first sub-sound-receiving hole 1131, and the second bottom plate 114 has a second sub-sound-receiving hole 1141 corresponding to the first sub-sound-receiving hole 1131. The first sub-sound-receiving hole 1131 and the second sub-sound-receiving hole 1141 together form the sound-receiving hole 111. After the sound wave S passes through the first sub-sound-receiving hole 1131 and the second sub-sound-receiving hole 1141 sequentially, the sound wave S drives the membrane structure 141 of the micro-electro mechanical microphone 140 to vibrate and is read by the micro-electro mechanical microphone 140 as a voltage signal.

In this embodiment, the second bottom plate 114 of the base 112 has at least one first through hole 1142, one second through hole 1143, and at least one third through hole 1144. The first inner partition plate 1152 and a part of the side wall 1151 form an airflow channel P. The first through hole 1142 is located corresponding to the airflow channel P, and the vibration sensor 120 covers the second through hole 1143 of the second bottom plate 114. In addition, a first cavity C1 of the micro-electro mechanical device 100 is formed between the first bottom plate 113 and the second bottom plate 114. The airflow channel P communicates with the first cavity C1 through the first through hole 1142, and the vibration sensor 120 covering the second through hole 1143 also communicates with the first cavity C1 through the second through hole 1143. In other words, the vibration sensor 120 and the airflow channel P communicate with each other through the first cavity C1.

In addition, the third through hole 1144 of this embodiment is a part of the back cavity 142, and the back cavity 142 is separated from the first cavity C1 by the spacer H1. The area of a projection of the first cavity C1 on the first bottom plate 113 is smaller than the area of a projection of the back cavity 142 on the first bottom plate 113. That is, a range of the first cavity C1 on the first bottom plate 113 is smaller than a range of the back cavity 142 on the first bottom plate 113, as shown in FIG. 2. In other embodiments of the disclosure, the range of the first cavity C1 on the first bottom plate 113 may be equal to the range of the back cavity 142 on the first bottom plate 113. Nevertheless, the disclosure is not limited thereto.

In this embodiment, the micro-electro mechanical device 100 further includes an upper cover 150, and the side casing 115 is located between the base 112 and the upper cover 150. The back cavity 142 is formed between the second inner partition plate 1153, a part of the side wall 1151, the first bottom plate 113, the second bottom plate 114, and the upper cover 150, as shown in FIG. 1 and FIG. 3.

In this embodiment, a spacer H3 is provided between the vibration membrane assembly 130 and the side casing 115, and a spacer H4 is provided between the vibration membrane assembly 130 and the upper cover 150. The spacer H3 and the spacer H4 of this embodiment are solder and silicon glue, respectively, but the disclosure is not limited thereto.

In this embodiment, a second cavity C2 of the micro-electro mechanical device 100 is located between the first inner partition plate 1152 and the second inner partition plate 1153. A third cavity C3 is formed between the vibration membrane assembly 130 and the upper cover 150, and the third cavity C3 is in air communication with the first cavity C1 through the airflow channel P. Accordingly, part of the air pressure in the first cavity C1 can be released to the third cavity C3 through the airflow channel P, and gas can flow back to the top of the vibration membrane assembly 130 to provide greater pressure to improve the sensitivity of the vibration sensor 120. Therefore, the vibration sensor 120 has better performance, higher sensitivity, and better low frequency curve performance.

Referring to FIG. 1 and FIG. 2, the second bottom plate 114 of this embodiment has a long side 1145 (FIG. 2) and a short side 1146 (FIG. 2), and the dimensions of the second bottom plate 114 correspond to the dimensions of the first bottom plate 113, as shown in FIG. 1. The first bottom plate 113 also has a long side and a short side. The first through hole 1142 is rectangular and close to the short side 1146, and the first through hole 1142 extends along the direction of the short side 1146. Because of the design of the shape and position of the first through hole 1142, the first bottom plate 113 has a relatively long and narrow shape, which allows the overall size of the micro-electro mechanical device 100 to be adjusted according to the needs of the user, and ensures that the micro-electro mechanical device 100 can be applied to devices of different sizes.

Figure 4:
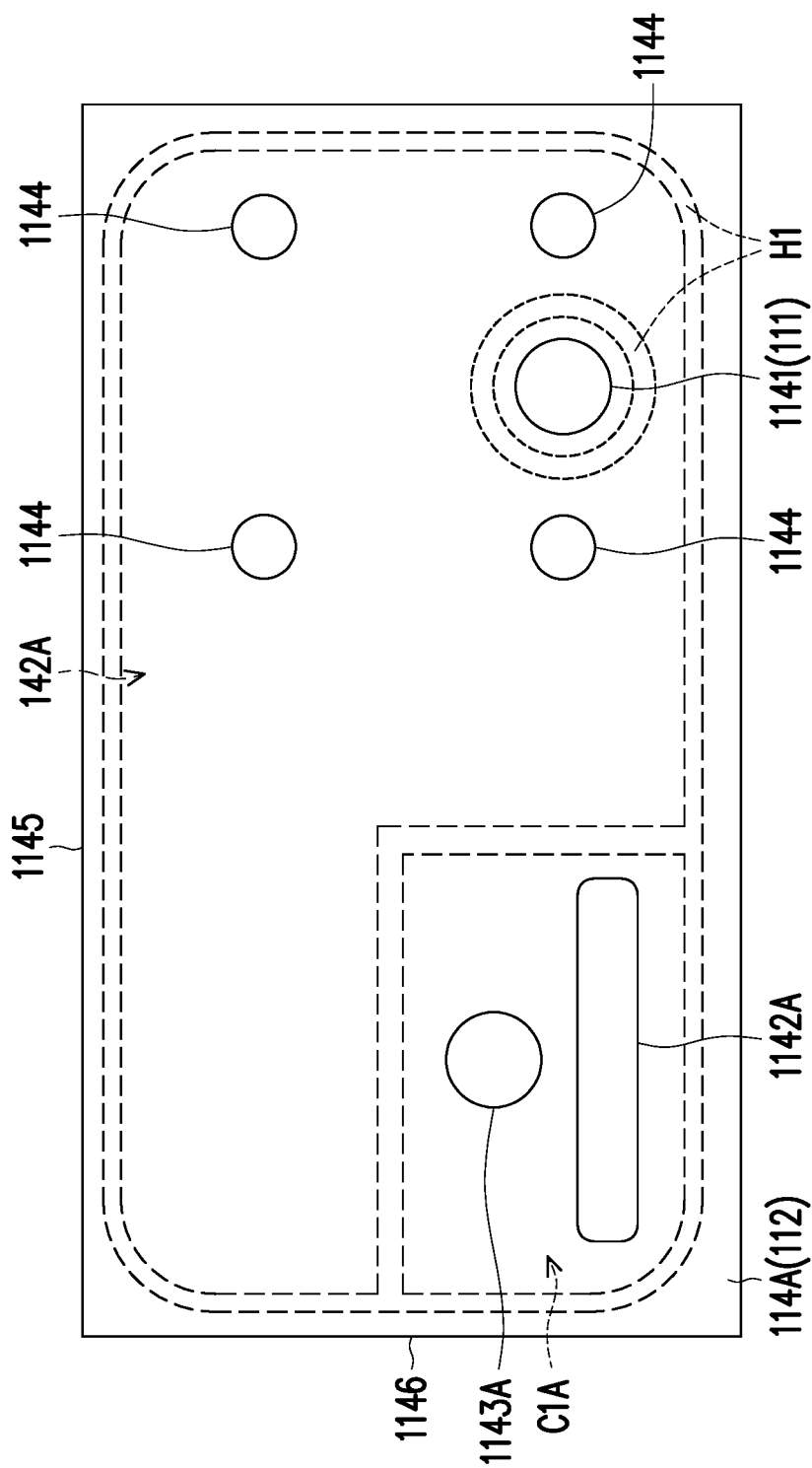
FIG. 4 is a schematic top view of a second bottom plate of a micro-electro mechanical device according to another embodiment of the disclosure.

FIG. 4 is a schematic top view of a second bottom plate of a micro-electro mechanical device according to another embodiment of the disclosure. Referring to FIG. 2 and FIG. 4, the micro-electro mechanical device 100A (not marked) of this embodiment is different from the micro-electro mechanical device 100 of the previous embodiment in that the first through hole 1142A (FIG. 4) of the micro-electro mechanical device 100A is located close to the long side 1145, and the first through hole 1142A extends along the direction of the long side 1145. The position of the second through hole 1143A is adjusted to be close to the short side 1146. As a result, the range of the back cavity 142A (FIG. 4) is greater than the range of the back cavity 142 shown in FIG. 2. Therefore, the ranges of the back cavity 142A and the first cavity C1A (FIG. 4) can be adjusted according to the needs of the user for customization.

Figure 5:
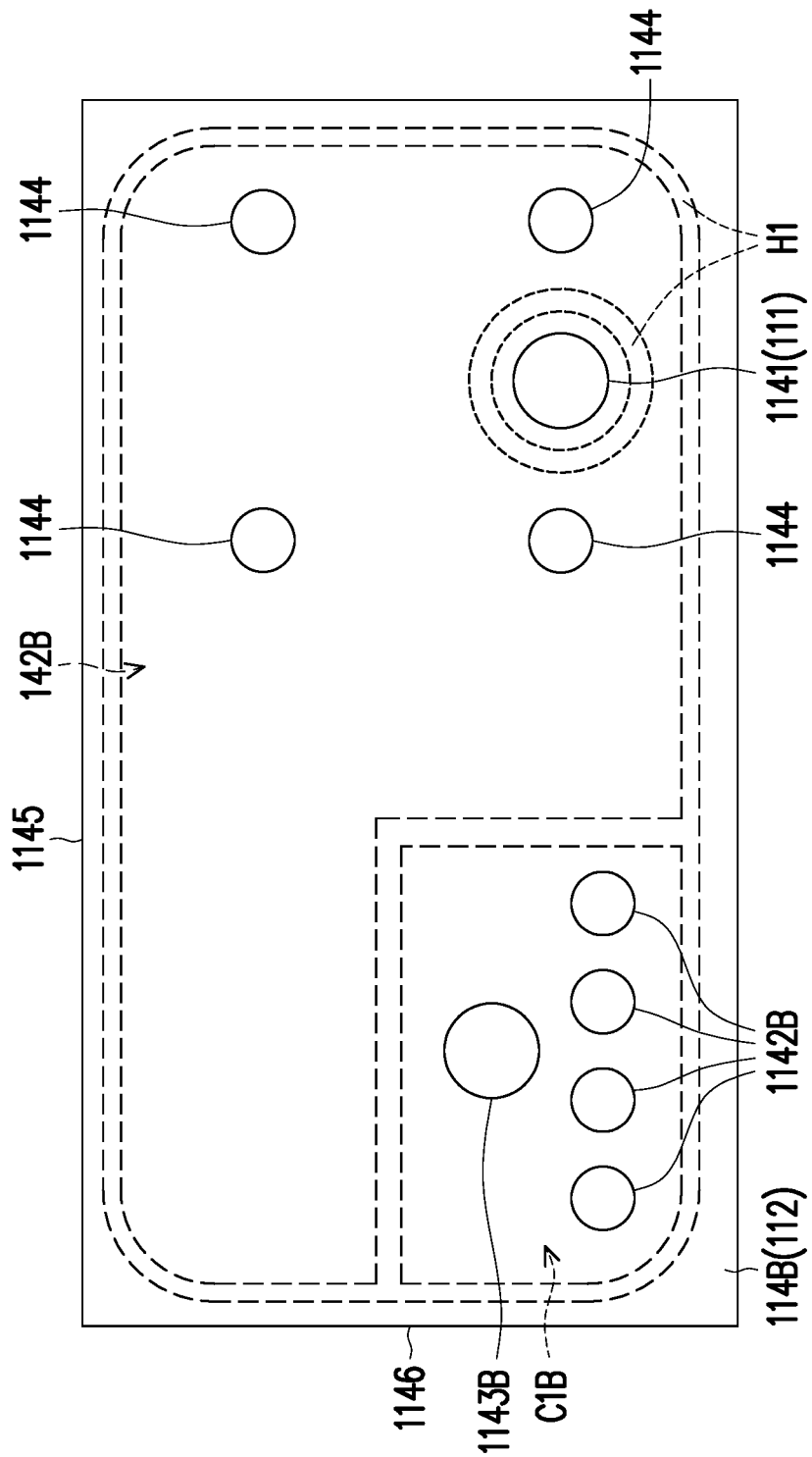
FIG. 5 is a schematic top view of a second bottom plate of a micro-electro mechanical device according to another embodiment of the disclosure.

FIG. 5 is a schematic top view of a second bottom plate of a micro-electro mechanical device according to another embodiment of the disclosure. Referring to FIG. 4 and FIG. 5, the micro-electro mechanical device 100B (not marked) of this embodiment is different from the micro-electro mechanical device 100A (not marked) of the previous embodiment in that the first through hole 1142B (FIG. 5) of the micro-electro mechanical device 100B is circular, and a plurality of first through holes 1142B are formed. The first through holes 1142B are located close to the long side 1145 and are arranged along the direction of the long side 1145. It is worth mentioning that the diameter of each of the first through holes 1142B may be greater than 100 micrometers (μm), and the number of the first through holes 1142B may be greater than or equal to three. Accordingly, there is enough air flux in the airflow channel (not shown) located corresponding to the first through holes 1142B to balance the pressure in the first cavity C1B (FIG. 5) and the third cavity (not shown), and gas can flow back to the top of the vibration membrane assembly 130 to provide greater pressure to improve the sensitivity of the vibration sensor 120. Therefore, the vibration sensor 120 has better performance, higher sensitivity, and better low frequency curve performance. In other embodiments of the disclosure, the first through hole 1142B may be rhomboid or triangular, but the disclosure is not limited thereto.

To sum up, in the micro-electro mechanical device according to the disclosure, the back cavity at least partially overlaps with the areas corresponding to the vertical projection of the vibration membrane assembly so as to increase the space of the back cavity, which helps the sound wave to more easily drive the membrane structure of the micro-electro mechanical microphone to vibrate and thereby improves the sensitivity of the micro-electro mechanical microphone to the sound wave. In addition, the micro-electro mechanical device according to the disclosure integrates the vibration sensor and the micro-electro mechanical microphone. When the micro-electro mechanical device is used as a component of a head-mounted device to be worn by the user, the micro-electro mechanical device can simultaneously sense the bone conduction vibration of the user and the acoustic signal in the air. Therefore, the micro-electro mechanical device has better sensing capability. Furthermore, in an embodiment, part of the air pressure in the first cavity can be released to the third cavity through the airflow channel to effectively balance the pressure. The vibration membrane assembly can move more smoothly because of the balance of pressure, and has better performance, higher sensitivity, and better low frequency curve performance. In an embodiment, the ranges of the back cavity and the first cavity can be adjusted according to the needs of the user for customization.

What is claimed is:

1. A micro-electro mechanical device, comprising:
a casing having a sound-receiving hole, a base, and a side casing, the base comprises a first bottom plate, and a second bottom plate located above the first bottom plate and separated from the first bottom plate, the side casing is disposed on the second bottom plate, the side casing comprises a side wall and a first inner partition plate located in the side wall, the second bottom plate has at least one first through hole, a second through hole, and at least one third through hole, the first inner partition plate and a part of the side wall form an airflow channel, the at least one first through hole is located corresponding to the airflow channel;
a vibration sensor disposed in the casing, the vibration sensor covers the second through hole of the second bottom plate;
a vibration membrane assembly disposed in the casing and corresponding to the vibration sensor; and
a micro-electro mechanical microphone disposed in the casing and corresponding to the sound-receiving hole, wherein a back cavity of the micro-electro mechanical microphone is formed in the casing, and the back cavity at least partially overlaps with areas corresponding to a vertical projection of the vibration membrane assembly, the at least one third through hole is a part of the back cavity.

2. The micro-electro mechanical device according to claim 1, wherein
the vibration sensor and the micro-electro mechanical microphone are disposed on the second bottom plate.

3. The micro-electro mechanical device according to claim 2, wherein the first bottom plate has a first sub-sound-receiving hole,
the second bottom plate has a second sub-sound-receiving hole corresponding to the first sub-sound-receiving hole, and
the first sub-sound-receiving hole and the second sub-sound-receiving hole together form the sound-receiving hole.

4. The micro-electro mechanical device according to claim 2, wherein
the side casing comprises a second inner partition plate located in the side wall,
the vibration sensor is located between the first inner partition plate and the second inner partition plate, and
the micro-electro mechanical microphone and the vibration sensor are separated by the second inner partition plate.

5. The micro-electro mechanical device according to claim 4, wherein the second bottom plate has a long side and a short side, and
the at least one first through hole is close to the short side and extends along a direction of the short side.

6. The micro-electro mechanical device according to claim 4, wherein the second bottom plate has a long side and a short side, and
the at least one first through hole is close to the long side and extends along a direction of the long side.

7. The micro-electro mechanical device according to claim 4, wherein the second bottom plate has a long side and a short side,
the at least one first through hole comprises a plurality of first through holes, and
the plurality of first through holes are close to the long side and are arranged along a direction of the long side.

8. The micro-electro mechanical device according to claim 7, wherein a diameter of each of the plurality of first through holes is greater than 100 and the number of the plurality of first through holes is greater than or equal to three.

9. The micro-electro mechanical device according to claim 4, wherein a first cavity is formed between the first bottom plate and the second bottom plate,
the airflow channel communicates with the first cavity through the at least one first through hole, and
the back cavity is separated from the first cavity.

10. The micro-electro mechanical device according to claim 4, further comprising an upper cover,
wherein the side casing is located between the base and the upper cover, and
the back cavity is formed between the second inner partition plate, a part of the side wall, the first bottom plate, the second bottom plate, and the upper cover.

11. The micro-electro mechanical device according to claim 10, wherein the back cavity between the first bottom plate and the second bottom plate extends to the areas corresponding to the vertical projection of the vibration membrane assembly.

12. The micro-electro mechanical device according to claim 4, further comprising an upper cover,
wherein the side casing is located between the base and the upper cover,
the vibration membrane assembly is disposed between the side casing and the upper cover,
a first cavity is formed between the first bottom plate and the second bottom plate,
an area of a projection of the first cavity on the first bottom plate is smaller than an area of a projection of the back cavity on the first bottom plate,
a second cavity is located between the first inner partition plate and the second inner partition plate,
a third cavity is formed between the vibration membrane assembly and the upper cover, and
the third cavity is in air communication with the first cavity through the airflow channel.

* * * * *